(12) United States Patent
Gilbert et al.

(10) Patent No.: US 8,632,201 B2
(45) Date of Patent: Jan. 21, 2014

(54) DISPLAY DEVICE WITH INTEGRATED PHOTOVOLTAIC CELLS, WITH IMPROVED LUMINOSITY

(75) Inventors: Joel Gilbert, Eguilles (FR); Philippe Cardi, Greasque (FR); Remy Tasse, Brussels (BE)

(73) Assignee: WYSIPS, Lambesc (FR)

( * ) Notice: Subject to any disclaimer, the term of this patent is extended or adjusted under 35 U.S.C. 154(b) by 154 days.

(21) Appl. No.: 13/399,711

(22) Filed: Feb. 17, 2012

(65) Prior Publication Data

US 2012/0236540 A1 Sep. 20, 2012

Related U.S. Application Data

(60) Provisional application No. 61/533,828, filed on Sep. 13, 2011.

(51) Int. Cl.
*H01L 31/042* (2006.01)
*G09F 13/04* (2006.01)

(52) U.S. Cl.
USPC .......... 362/97.1; 362/97.3; 362/557; 136/244

(58) Field of Classification Search
USPC .................. 362/97.1–97.4, 557; 136/244
See application file for complete search history.

(56) References Cited

U.S. PATENT DOCUMENTS

| 6,046,401 A * | 4/2000 | McCabe ................. 136/244 |
| 8,104,203 B2 * | 1/2012 | Mackler ................. 40/492 |
| 2006/0227531 A1 * | 10/2006 | Iou ....................... 362/84 |
| 2007/0102035 A1 * | 5/2007 | Yang ..................... 136/244 |
| 2010/0245731 A1 * | 9/2010 | Limketkai et al. ...... 349/106 |
| 2011/0317121 A1 * | 12/2011 | Lin et al. ............... 349/158 |

FOREIGN PATENT DOCUMENTS

TW 201314940 A * 4/2013

* cited by examiner

*Primary Examiner* — Mariceli Santiago
(74) *Attorney, Agent, or Firm* — Buchanan Ingersoll & Rooney PC

(57) ABSTRACT

A display device, in particular digital display screen, with integrated photovoltaic cells, including (a) an array of image zones emitting light or backlit by a light source placed behind the array of image zones, (b) an array formed by a plurality of photovoltaic cells and a plurality of orifices, in which array two neighboring photovoltaic cells form an orifice, and (c) a lenticular array making it possible to focus the light emitted by the image zones into the orifice between two neighboring photovoltaic cells. The lenticular array of the display device is positioned between the array of image zones and the array of photovoltaic cells.

19 Claims, 4 Drawing Sheets

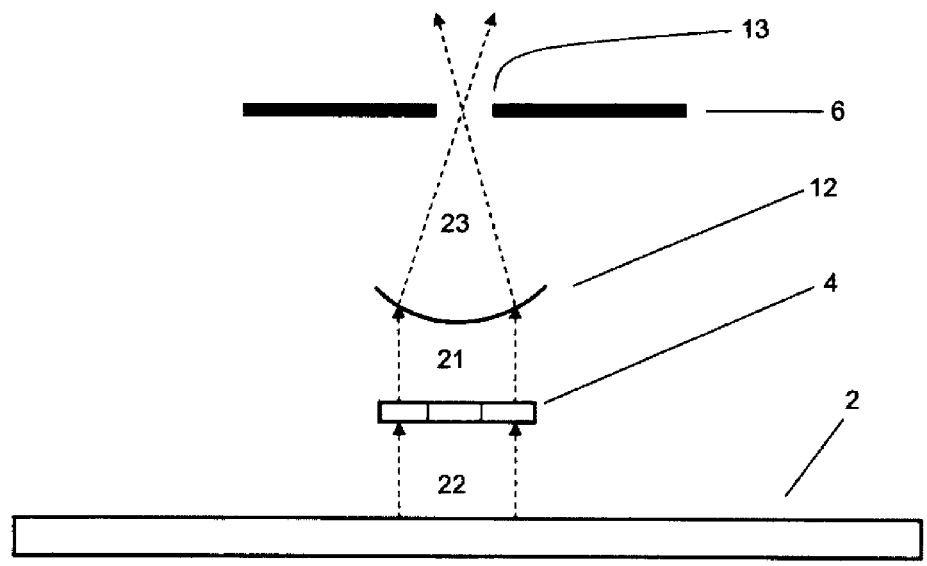
Figure 6
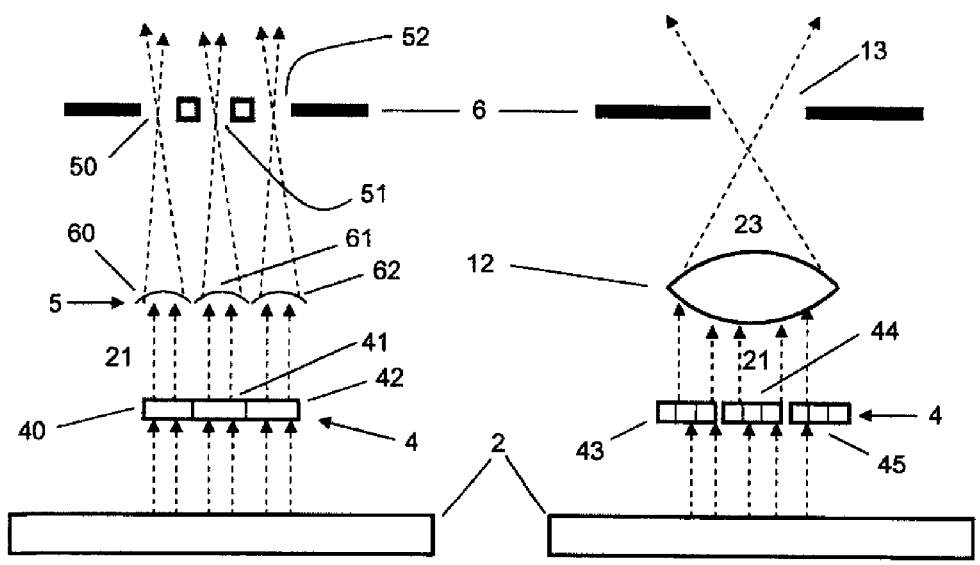
Figure 7                    Figure 8

DISPLAY DEVICE WITH INTEGRATED PHOTOVOLTAIC CELLS, WITH IMPROVED LUMINOSITY

CROSS REFERENCE TO RELATED APPLICATION

Priority is claimed under 35 U.S.C. §119(e) to Provisional Application No. 61/533,828, filed Sep. 13, 2011.

FIELD OF THE INVENTION

The present disclosure relates to the field of display devices, and more particularly to the field of backlit display screens.

BACKGROUND OF THE INVENTION

Screens comprising a large number of backlit pixels have been known for some time and used in, for example, television sets, computers and portable devices of small size, such as, for example, mobile telephones, games consoles and calculators. The term "backlit" image zone connotes an image zone, which is situated in front of a light source which illuminates it from the rear. The image zone may for example be a pixel, a plurality of pixels or a part of a pixel (for example a liquid crystal pixel) or else a strip of film on which an image has been printed. In a backlit screen, a diffuse light source is placed behind the plane of the pixels, so as to improve the contrast.

Portable devices are generally powered by electric batteries, the duration between charges being a significant factor in convenience of use. With the aim of increasing this duration between charges, photocells have been integrated into these portable devices, which produce part of the current required for the operation of said device. Insofar as the space available for arranging photocells on the external surface of said portable devices is very restricted, it would be desirable to integrate the photocells into the display screen.

The prior art shows a certain number of examples of such integration. A first approach consists in depositing semitransparent photovoltaic cells (see EP 1 174 756 (ETA), U.S. Pat. No. 7,206,044 (Motorola), WO 2009/052326, US 2010/284055, WO 2009/065069 (Qualcomm), US 2010/245731 (Intel)). Another approach consists in depositing photovoltaic layers in the form of strips between which the light from the pixels passes (see US 2002/0119592 (BP), U.S. Pat. No. 4,795,500 (Sanyo), WO 2009/098459 (M-Solv)). All these approaches lead to screens which are either not very luminous, or the surface area of the photovoltaic cells, which is, for a given cell type, proportional to the energy converted, is small.

Document US 2007/0102035 (X. Yang) shows another approach to such integration, in which photocells covering zones arranged on the surface of the screen collect the ambient diffuse light, while a system of lenses arranged behind the display screen focuses the back-illuminating light onto zones that are not covered with photocells.

However, these photocells must not degrade either the imaging characteristics or the luminosity of the screen in which they have been integrated, and this is why the total area available for these photocells is in fact very restricted; indeed, the width of the photocells cannot be significantly greater than the space between two pixels, a space that it is desirable to minimize in order to improve the resolution of the screen. If the photocells are larger, and a fortiori when they partially cover the surface of the pixels, as is the case in the embodiment discussed above in document US 2007/0102035, the luminosity and the resolution of the image generated by the screen are degraded. This same document comprises another embodiment in which the back-illumination light is focused in the space between the photocells by a lens situated between the back-illumination light source and the substrate on which the array of pixels is located; this embodiment presents the drawback of requiring extremely precise positioning of the lens, both as regards its lateral position, but especially its distance with respect to the photocells. Moreover, it does not make it possible to integrate the light source for the backlighting directly into the substrate of the field effect transistors which control the liquid crystals forming the pixels of the screen.

The present disclosure therefore seeks to present a display screen with integrated photovoltaic cells, which allies a high proportion of photovoltaically active surface with a high luminosity of the display. Preferably, this integration of photovoltaic cells does not require substantial modifications to the design of the display screen, and in particular of the "pixel control" part, so as to be able to use known screen designs.

Within the framework of the present disclosure, this problem is solved by the judicious association of three essential elements: an array of pixels which generates an image, a plurality of photovoltaic cells, and a plurality of lenses forming a lenticular array. Each of these three elements is characterized by its shape, its dimension and its positioning with respect to the other, to form a digital display screen with integrated photovoltaic cells.

SUMMARY OF THE INVENTION

Devices and methods for providing integrated photovoltaic cells, with improved luminosity are disclosed herein.

According to an exemplary embodiment, a display device, in particular a digital display screen, with integrated photovoltaic cells, comprises an array of image zones emitting light or backlit by a light source placed behind the array of image zones; an array formed by a plurality of photovoltaic cells and a plurality of orifices, in which array two neighboring photovoltaic cells form an orifice, a lenticular array making it possible to focus the light emitted by said image zones into the orifice between two neighboring photovoltaic cells, said device being characterized in that said lenticular array is positioned between said array of image zones and said array of photovoltaic cells.

The device comprises an array of image zones, which may entail pixels. Here, the term "pixel" encompasses either an individual pixel of single color, or a plurality of parts of a pixel (typically three, namely colored blue, red and green) which cooperate to create a light spot of a color which is determined as a function of the intensity emitted by each zone. These image zones or pixels form an ordered array; the techniques of pixel-based display are known to the person skilled in the art. The screen according to the disclosure may be backlit by means of a source of light placed behind the array of image zones or pixels (for example in the case of a screen of Liquid Crystal Display (LCD) type or in the case of an advertising panel comprising image zones in the form of printed parallel strips, preferably translucent) and/or the pixels may actively emit light (for example electroluminescent pixels). The screen may be a flexible or rigid screen. On its external face it may comprise a tactile film or layer, so as to allow the user to enter data by way of a tactile pathway.

In other exemplary embodiments, the image zones, pixels and/or parts of pixels are ordered in such a way that various groups of image zones, pixels and/or parts of pixels generate different images.

The device moreover comprises a plurality of photovoltaic cells which form or contain a plurality of orifices through which the light from the image zones or pixels can pass. The orifices may have any shape, for example rectangular or circular. The cells may be deposited on an appropriate substrate, for example a plate or a film. The photovoltaic cells deposited on their substrate will subsequently be referred to as a "photovoltaic plate", this in no way implying that they are mechanically rigid. On the contrary, said substrate may be flexible, bendable. The photovoltaic cells may have any shape, but preferably rectangular.

They may take the form of parallel strips which alternate with empty strips (orifices), i.e. not comprising any photovoltaic cells. These strips are preferably equidistant, forming an ordered array. By virtue of the orifices, the photovoltaic plate is partially transparent; the so-called external optical transmission ($T_{ext}$) of the photovoltaic plate is determined in large part by the surface fraction occupied by the photovoltaic cells, and by their intrinsic optical transmission.

The photovoltaic cells are advantageously thin-film photovoltaic cells based on amorphous or microcrystalline silicon, since cells of this type are particularly suitable for converting low-intensity light (diffusing light, light inside rooms); but these photovoltaic cells may also be made with any other suitable technology, for example based on CdTe or CIGS (copper-indium-gallium-selenium) or based on polymers. They may entail junctions of p-i-n or p-n type, or else tandem cells, i.e. comprising two overlaid cells which preferentially absorb a different part of the luminous spectrum. They may be designed to convert visible light and/or ultraviolet light and/or infrared light into electricity. They may be at least partially transparent to visible light. They may be protected by a protective layer, which is advantageously provided with an antireflection layer.

The device comprises a plurality of lenses. Here, the term "lens" is understood to mean any device made of a transparent material, isotropic or otherwise, having the property of deviating and/or concentrating or diverging the light rays. In this broad definition, the term "lens" here comprises prisms, parabolic concentrators, Fresnel lenses. Typically this plurality of lenses takes the form of a film or a lenticular plate, which comprises a plurality of lenses. These may be circular circumference lenses, but preference is given to a lenticular array comprising a juxtaposition of identical rectilinear lenses, the longitudinal axis of which is parallel to the strips of photovoltaic cells. Here, we shall refer to this plurality of lenses as "lenticular plates" or "lenticular array", regardless of its embodiment.

Advantageously, the plane of the photovoltaic plate, the plane of the lenticular array and the plane of the pixels are substantially parallel, but these planes may be domed (while remaining parallel), especially in the case where the screen is a flexible screen. The lenticular plates may be made of an appropriate transparent plastic, such as PET.

According to the present disclosure, the shape of the lenses, their optical characteristics and their positioning with respect to the photovoltaic plate are such that a light beam originating from an image zone (for example from a pixel or from part of a pixel) and passing through a lens will have on exiting the lens, typically through the effect of an optical deviation and/or concentration, a direction enabling it to pass through at least partly, but preferably entirely, the orifice between two adjacent photovoltaic cells. If the entire luminous intensity originating from the pixels passes into the orifices, the so-called internal optical transmission ($T_{in}$) of the photovoltaic plate is a maximum. However, the aim of the present disclosure may be achieved even if part of the light originating from the pixels is absorbed by the photovoltaic plate. Typically, to each lens there corresponds an orifice of suitable shape and suitable size. In a general manner, the lenses forming the lenticular plate (and which are advantageously arranged in such a way as to form a lenticular array) may have any appropriate shape and appropriate characteristic; they may in particular be plane-convex or biconvex lenses, or else spherical and/or aspherical lenses, or else symmetric or asymmetric lenses, or else variable-index lenses.

More particularly, the array of image zones is advantageously positioned with respect to the lenticular plate and with respect to the photovoltaic plate in such a way that the light originating from each image zone or part of an image zone and received by the corresponding lens of the lenticular plate is deviated and/or concentrated by this lens in such a way as to pass fully, or at least in large part, through one of the orifices of the photovoltaic plate.

In an advantageous embodiment, the lenticular array comprises a juxtaposition of identical rectilinear lenses, the longitudinal axis of which is parallel to the strips of photovoltaic cells.

To avoid parasitic reflections on passing from the lenticular plate to the photovoltaic plate and vice versa, the two plates may be glued or may constitute just a single plate comprising the photovoltaic cells and also the lenses.

In a general manner, to at least partly eliminate the reflection of the ambient light on the surface of the photovoltaic plate, the latter may comprise at least one antireflection layer. Here, this term encompasses a specific coating or a surface treatment of said photovoltaic plate, or else an optical microstructuration of the surface, or else a multilayer coating comprising layers of different refractive indices.

The device according to the disclosure preferably exhibits an internal transmission of the photovoltaic plate ($T_{in}$) which is high, and a low external transmission ($T_{ext}$), this being obtained by virtue of the judiciously chosen and positioned lenticular plate, as indicated hereinabove. Thus, a well-resolved and luminous image and significant photovoltaic conversion of the external light are obtained at one and the same time. On the other hand, in the absence of the lenticular plate, the two transmissions $T_{in}$ and $T_{ext}$ are of the same order of magnitude, and the quality of the image is to the detriment of the photovoltaic conversion.

Another subject of the present disclosure is an assembly consisting of a photovoltaic plate and an associated lenticular array which can be bonded to a digital display screen to form a digital display screen with integrated photovoltaic cells, as described previously. More particularly, the assembly can consist of a transparent film or substrate, preferably flexible or semi-rigid, typically made of a polymer, on which said lenticular array has been deposited, and on which an array of photovoltaic cells has been deposited. The latter are optionally protected, as indicated hereinabove, by a protective layer, for example a surface deposition (thin layer) or a flexible film. The protective layer may be continuous or discontinuous. This assembly, which we shall refer to here as a "photovoltaic film (or plate) with integrated lenses" may be bonded and fixed, for example by gluing, onto the external surface of a digital display screen. This external surface is preferably smooth; it may be flat or domed, rigid or flexible. This photovoltaic film or plate with integrated photovoltaic cells also comprises the electrodes, typically thin-film electrodes, required to connect the photovoltaic cells together and to collect the current.

Another subject of the present disclosure is a method of manufacturing a digital display screen by using the photovoltaic plate with integrated lenses according to the disclosure, which comprises the following steps: a digital display screen comprising a smooth external surface is provided, a photovoltaic plate with integrated lenses according to the disclosure is provided, and said photovoltaic plate with integrated lenses is bonded and fixed, preferably by gluing, onto said digital display screen so as to form a digital display screen with integrated photovoltaic cells. After bonding the photovoltaic plate onto the external surface of the screen, an electrical connection is established between the electrodes of the photovoltaic plate with integrated lenses and an element for electrically powering the screen, so that the electrical energy generated by the photovoltaic cells can contribute to electrically powering the portable or fixed electronic apparatus in which said screen is integrated; this power may be supplied directly or indirectly (by charging an electrical energy storage means, such as a rechargeable cell or a capacitor).

These and other features of the present disclosure will be readily appreciated by one of ordinary skill in the art from the following detailed description of various implementations when taken in connection with the accompanying drawings.

BRIEF DESCRIPTION OF THE DRAWING FIGURES

FIGS. 1 to 9 schematically illustrate embodiments of the present disclosure, but do not limit the invention. It is understood that all the embodiments and all the variants presented may be combined together. These figures do not show certain components which are indispensable to the operation of a display screen, in particular the layer of field effect transistors which is essential for generating an image in a liquid crystal screen.

Figure 1:
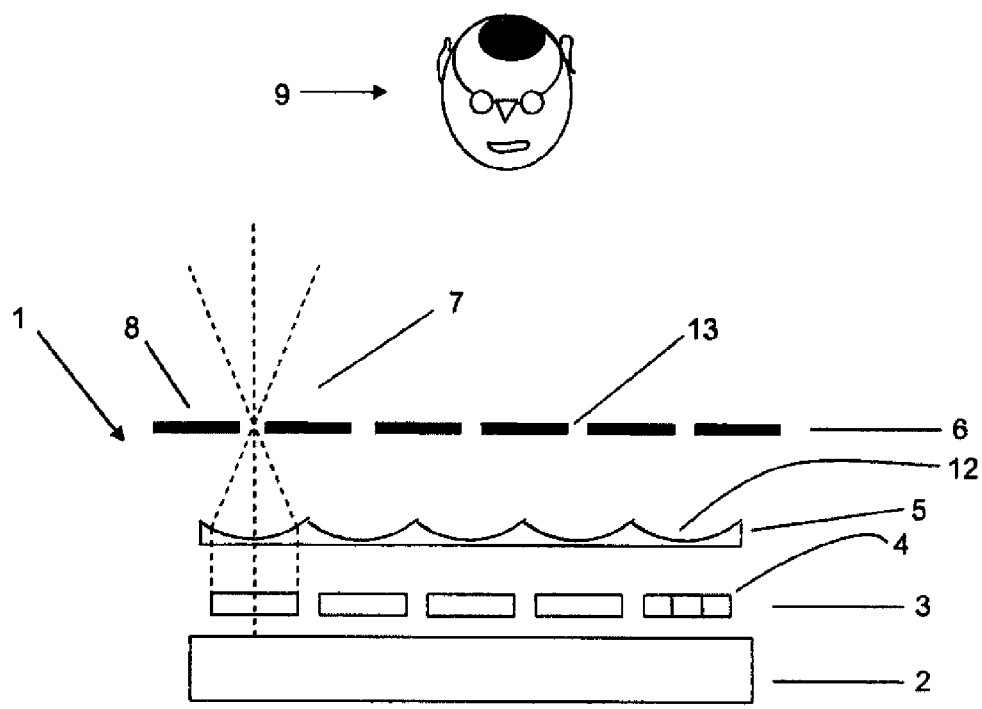
FIG. 1 is a schematic illustration of a display device according to an embodiment of the disclosure.

FIGS. 3-8 schematically illustrate, in simplified manners, other representations of the display device of FIG. 1.

Figure 9:
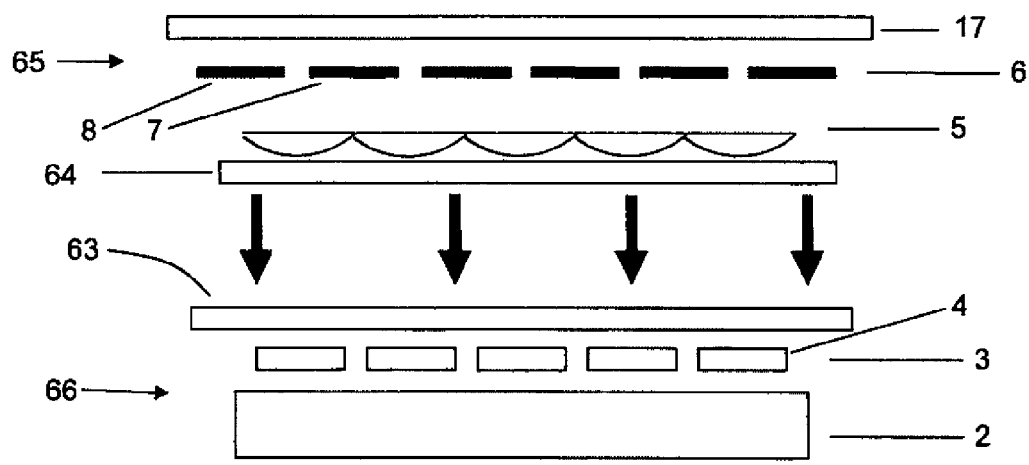

FIG. 9 schematically illustrate the method of manufacturing a display screen according to an embodiment of the disclosure.

Figure 10:
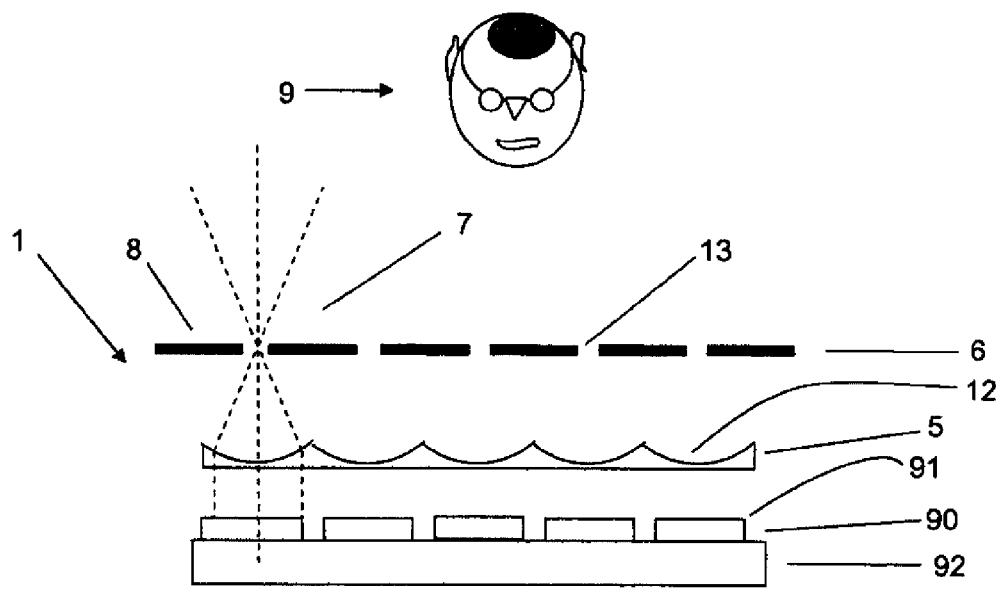

FIG. 10 illustrates a display device according to an embodiment of the disclosure.

Figure 11:
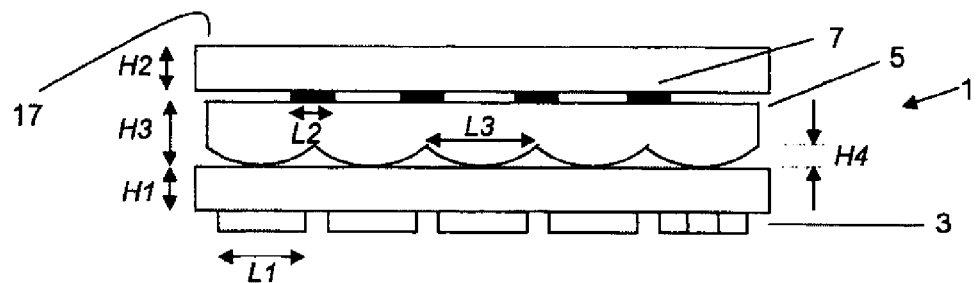

FIG. 11 schematically illustrates an example of a photovoltaic plate with integrated lenses according to an embodiment of the disclosure.

Further areas of applicability of the present disclosure will become apparent from the detailed description provided hereinafter. It should be understood that the detailed description of exemplary embodiments are intended for illustration purposes only and are, therefore, not intended to necessarily limit the scope of the disclosure.

DETAILED DESCRIPTION OF THE INVENTION

FIG. 1 schematically shows an embodiment of the disclosed device. FIG. 1 represents a cross section through a display screen according to the disclosure. The display screen 1 comprises an array 3 of image zones 4 (which may be pixels) backlit by a light source 2, typically flat, placed behind the array 3 of image zones 4. The flat light source 2 may be a diffusing plate. In a variant embodiment, the array 3 of pixels 4 is not backlit by a light source 2, but each pixel 4 itself constitutes a light source, for example by electroluminescence. As indicated above, each pixel 4 may be formed by a plurality of units of different color, typically by three units (red, blue, green). This is illustrated, for example, in FIG. 1 and applies to all the embodiments of the present disclosure.

The screen 1 according to the disclosure also comprises an array 6 of strips of photovoltaic cells 7, 8; the figure does not show the substrate on which they have been deposited. The screen 1 also comprises a lenticular array 5 which comprises a juxtaposition of identical rectilinear lenses, the longitudinal axis of which is parallel to the strips of photovoltaic cells 7, 8. The lenticular array is positioned between said array 3 of image zones 4 and said array 6 of photovoltaic cells 7, 8. The lenticular array 5 may consist of a juxtaposition of identical, rectilinear or other lenses 12, which may be of plane-convex or biconvex type, or the like; they may be of symmetric or asymmetric, spherical or aspherical type. Advantageously, said lenticular array 5 generates an individual-lens effect for each pixel 4, focusing the light originating from the pixel 4 into the orifice 13.

As represented by the dotted line, the light beam coming from a pixel 4 is concentrated by a corresponding lens of the lenticular array, in order to be directed as precisely as possible through a corresponding orifice 13 of the photovoltaic array 6. As explained below, in the case where a portion of the light beam emitted by the pixel 4 experiences parasitic reflexions disabling it to pass through an orifice, the quality of the image perceived by observer 9 could be somewhat diminished, but it will still be possible to regain the non transmitted but diffused light energy, in order to generate an incremental photovoltaic energy from photovoltaic cells arranged on the inner surface of the photovoltaic plate, which is oriented toward the pixels 4.

In a general manner, the image zones 4 do not all need to be in the same plane, but they may be arranged on several substantially parallel planes. The pixels 4 may be subdivided into cells, for a color display, according to technologies known to the person skilled in the art, for example each pixel may be subdivided into three cells colored red, green and blue.

In all the embodiments of the disclosure, the photovoltaic cells 7 may use any known and appropriate thin-film technology. For screens intended for devices used indoors, it is preferable to use cells which have good efficiency of conversion at low luminosity (for example cells based on amorphous or microcrystalline silicon), since said cells will principally capture diffusing light.

In all the embodiments of the disclosure, the screen 1 may comprise other components which improve its characteristics or which adapt them to certain particular situations of use. By way of example, the screen 1 may also comprise one or more following elements: a color filter, a polarizing filter, a lenticular element, a light diffuser, a protective layer. The screen 1 may also be a flexible screen.

Figure 2:
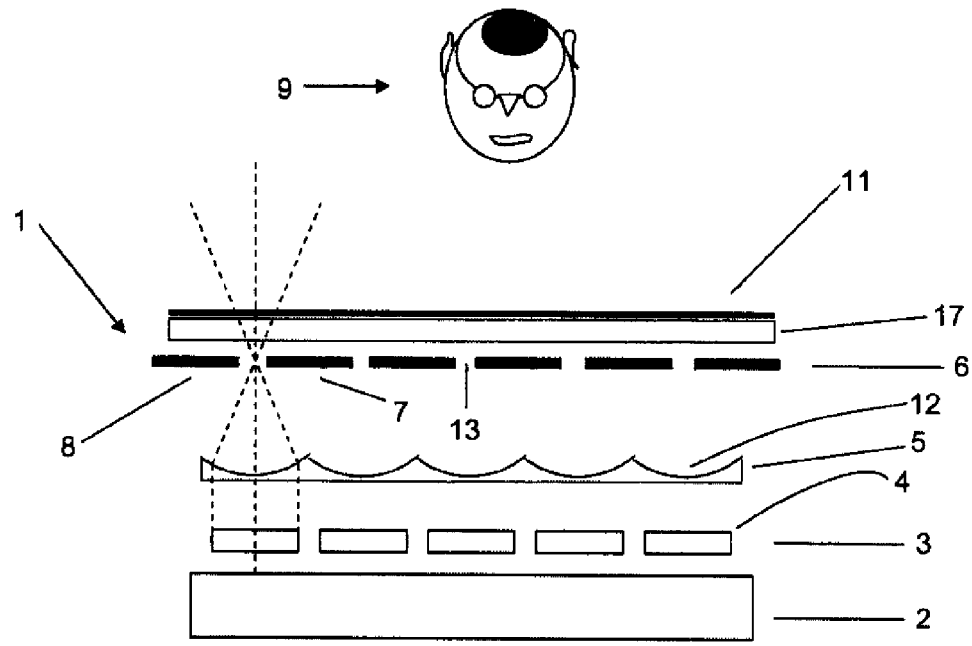
FIG. 2 illustrates a variant of the display device of FIG. 1.

FIG. 2 schematically shows a variant embodiment, that can be combined with all the other embodiments of the present disclosure, in which the array 6 of photovoltaic strips is protected by a protective layer 17 which may be rigid or flexible, continuous or discontinuous. For example, the protective layer 17 may be a polymer film. This layer may comprise an antireflection layer 11, advantageously on the external face (i.e. the face turned towards the observer 9). The protective layer 17 may form the substrate on which said array 6 of strips of photovoltaic cells 7, 8 has been deposited.

Figure 3:
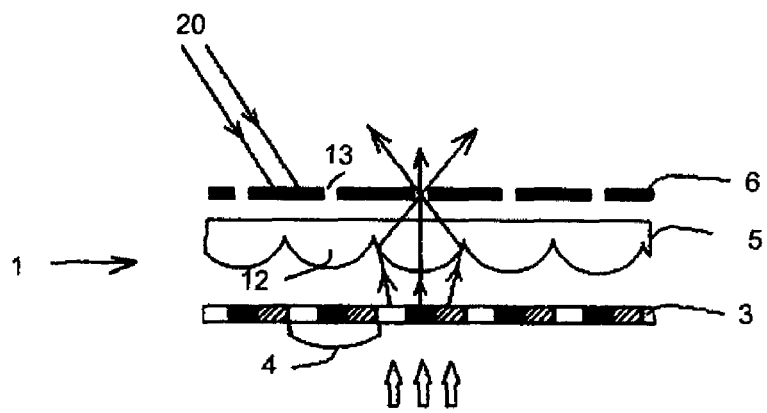

FIG. 3 schematically shows in a simplified manner another representation of a similar embodiment. The array of pixels 3 is backlit (white arrows), the light source is not shown in this figure. The optical paths of the beams originating from each of the three zones of the pixels 4 are clarified.

Figure 4:
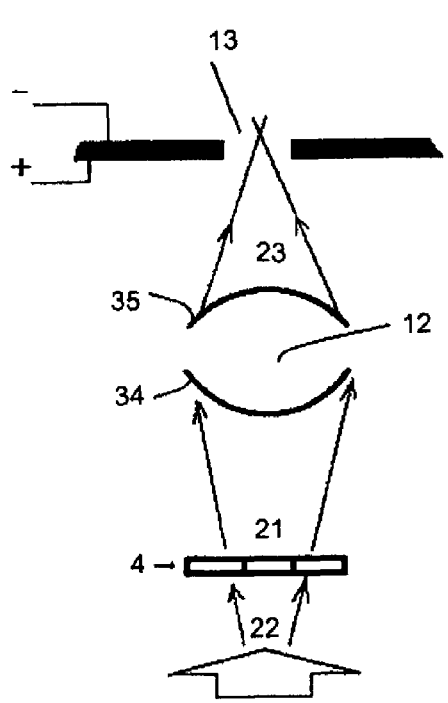

FIG. 4 schematically shows in a simplified manner another particular embodiment in which the light beam 21 originating from the image zone 4 is divergent; this may be achieved for example with a pixel 4 of LCD type backlit by a divergent light beam 22 (as shown in FIG. 4), or by an electroluminescent pixel of LED or OLED type (variant not shown in the figure). In this case the corresponding lens 12 is advantageously convergent with a first convex face 34 and if needed a second convex face 35, so as to reduce the focal length of the lens 12 and thus obtain a convergent light beam 23 focused on the orifice 13 after passing through the lens 12 and/or to increase the exit angle of the exiting light beam.

Figure 5:
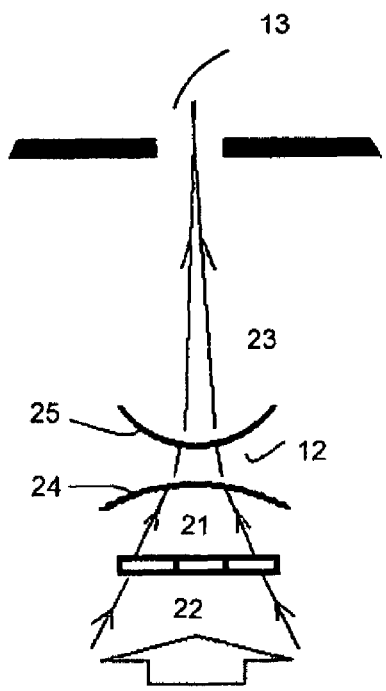

In another embodiment shown schematically and in a simplified manner in FIG. 5, the light beam 21 originating from the pixel 4 is convergent; this may be achieved for example with a pixel 4 of LCD type backlit by a convergent light beam 22. The corresponding lens 12 may then be divergent, with a first concave face 24 and if needed a second concave face 25 so as to increase the focal length of the lens 12 and thus obtain a convergent light beam 23 focused onto the orifice 13 and whose focal plane will have been offset by shifting away from the pixel. This need may arise for example in order to increase the overall thickness of the lenticular plate and/or to reduce the exit angle of the light beam.

In another embodiment shown schematically and in a simplified manner in FIG. 6, the light beam 21 originating from the image zone 4 is parallel; this may be achieved for example with a pixel of LCD type backlit by a parallel light beam 22. In this case the corresponding lens 12 may be convergent, with a convex face so as to create a convergence of the light beam into a focal plane close to the corresponding orifice 13 of the photovoltaic plate 6.

In yet another embodiment shown schematically and in a simplified manner in FIG. 7, the orifices 50, 51, 52 of the photovoltaic plate 6 and the lenses 60, 61, 62 of the lenticular plate 5 are in correspondence with the light emitted by a part 40, 14, 42 only of the pixel 4. This part 40, 41, 42 of the pixel 4 may correspond for example to a particular zone, corresponding to one of the colors, red, green or blue, of an LCD pixel; its light is deviated by the corresponding lens 60, 61, 62 so as to each be focused in a corresponding orifice 50, 51, 52.

In yet another embodiment shown schematically and in a simplified manner in FIG. 8, to each lens 12 there corresponds a group of pixels 43, 44, 45 whose assembly of exiting light beams are deviated by a lens 12 associated with this group of pixels 43, 44, 45 which focuses them in the orifice 13.

In all the embodiments, it is not strictly necessary for the focusing of the light originating from the pixels 4, 43, 44, 45 or parts 40, 41, 42 of pixels to occur in the orifice 13, 50, 51, 52, but focusing in the orifice gives the best luminosity and quality of display.

The photovoltaic plate 6 still comprises the electrodes, typically thin-film electrodes, required to connect the photovoltaic cells together and to collect the current (not shown in the figures).

In a particular embodiment, not illustrated by a figure, the device 1 according to the disclosure comprises two different assemblies of photovoltaic cells, one dedicated to the photovoltaic conversion of the ambient light 20 (referred to as "external light"), and the other dedicated to the photovoltaic conversion of the diffusive light originating from the pixels and/or from their backlighting (referred to here as "internal light"). For example, a first assembly of photovoltaic cells may be arranged on the external face of the photovoltaic plate (and are then preferably protected by a protective film or layer), intended to convert the external light, and a second assembly of photovoltaic cells may be arranged on the internal face of the photovoltaic plate, intended to convert the internal light.

The digital display screen 1 according to the disclosure may be incorporated into a fixed or portable electronic apparatus; this apparatus forms another subject of the disclosure. It may in particular be a portable telephone, an electronic book, a portable television screen, a portable computer screen. There may also be fixed apparatuses of more significant size, for example a fixed television screen or advertising display. The digital display screen 1 according to the disclosure can comprise a tactile coating or film, that is to say one which is touch sensitive, so as to obtain a tactile screen.

FIG. 9 schematically shows the method of manufacturing a display screen 1 with integrated photovoltaic cells according to the disclosure: the photovoltaic plate, comprising the array 6 of photovoltaic cells (typically photovoltaic strips) which are optionally covered with a protective layer 17 (itself optionally covered with an antireflection layer 11), associated with the lenticular array 5 (optionally deposited directly on this lenticular array or separated by a plate or a film, not shown in the figure) forms a photovoltaic plate with integrated lenses assembly 65 which may be bonded to a digital display screen 66 to form a digital display screen 1 with integrated photovoltaic cells as described previously. More particularly, said photovoltaic plate with integrated lenses 65 may consist of a transparent film 64, preferably flexible or semi-rigid, typically made of a polymer, on which said lenticular array 5 has been deposited, on which said array 6 of photovoltaic cells 7, 8 has been deposited on at least one of their faces, the latter possibly protected, as indicated hereinabove, by a protective layer 17, for example a surface deposition (thin layer) or a flexible film.

This photovoltaic plate with integrated lenses 65 may be bonded and fixed, for example by gluing, onto the external surface 63 of a digital display screen 66, as indicated by arrows in FIG. 9. This external surface 63 is preferably smooth; it may be flat or domed, rigid or flexible. This photovoltaic film with integrated lenses 65 also comprises the electrodes, typically thin-film electrodes, required to connect the photovoltaic cells together and to collect the current (not shown in the figures).

FIG. 10 shows yet another embodiment of the disclosure. The display device 1 comprises an array 90 of the image zones 91, which are typically deposited or printed on a substrate 92 and backlit. The substrate 92 is advantageously transparent or at least translucent; it may be a flat light source. The image zones 91 may form parallel strips, the lengthwise direction of which is parallel to that of the lenses 12 forming the lenticular array 5. As in the other embodiments, the lenticular array 5 focuses the light originating from the image zones. This embodiment is particularly well suited to display devices of large size presenting fixed images, for example advertising posters, signs, decorative plates arranged outside or inside buildings.

FIG. 11 schematically shows an example of a photovoltaic plate with integrated lenses according to the disclosure which has been made in the following manner: a photovoltaic cell of p-i-n type based on hydrogenated amorphous silicon has been deposited on a flexible glass substrate 17 with a thickness H2 of around 500 µm covered with a conductive and transparent layer of $ZnO_2$, on which cell has then been deposited a layer of ITO. This photovoltaic cell produces an open-circuit voltage of around 8 V. By wet etching of the ITO layer with acid, followed by reactive ion etching (RIE) in a plasma formed from an atmosphere of $SF_6$ for silicon, parallel strips have been cut in this photovoltaic cell, to obtain an array of photovoltaic strips 6.

A lenticular plate 5 made of PET with a thickness H3 of around 125 μm has been used with cylindrical lenses having a pitch L3 of 91 μm a height H4 of around 26 μm and an aperture angle of 120°, marketed by the company Microsharp.

The photovoltaic plate and the lenticular plate have been assembled to form a photovoltaic plate with integrated lenses. This plate, with a dimension of around 4.2 cm×3.7 cm, has been glued onto the screen of a portable telephone of SGH-F490 type marketed by the company Samsung, fitted with a glass plate with a thickness H1 of around 700 μm behind which is the array 3 of pixels of individual width L1 of around 160 μm. An electrical link between the photovoltaic plate and the power supply circuit of the telephone has been established in such a way as to allow the recharging of the battery by the photovoltaic plate.

Techniques consistent with the present disclosure provide, among other features, a device and method of providing integrated photovoltaic cells, with improved luminosity. While various exemplary embodiments of the disclosed device and method have been described above it should be understood that they have been presented for purposes of example only, not limitations. It is not exhaustive and does not limit the disclosure to the precise form disclosed. Modifications and variations are possible in light of the above teachings or may be acquired from practicing of the disclosure, without departing from the breadth or scope. The scope of the present disclosure is defined by the claims and their equivalents.

LIST OF LABELS

1 Display device
2 Light source
3 Array of image zones
4 Image zone
5 Lenticular array
6 Array of photovoltaic cells
7,8 Photovoltaic cells
9 Observer
11 Antireflection layer
12 Lens
13 Orifice
17 Protective layer
20 External light
21, 22, 23 Light beam
24,25 $1^{st}$ and $2^{nd}$ concave face
34,35 $1^{st}$ and $2^{nd}$ convex face
40, 41, 42 Part of an image zone
43, 44, 45 Group of image zones
50, 51, 52 Orifices
60, 61, 62 Lenses
63 External surface
64 Transparent film
65 Photovoltaic plate with integrated lenses
66 Digital display screen

What is claimed is:

1. A display device, with integrated photovoltaic cells, comprising:
    an array of image zones emitting light or backlit by a light source placed behind the array of image zones;
    an array formed by a plurality of photovoltaic cells and a plurality of orifices formed between two neighboring photovoltaic cells of said array; and
    a lenticular array for focusing the light emitted by said image zones into the orifice between two neighboring photovoltaic cells, wherein
    said lenticular array is positioned between said array of image zones and said array of photovoltaic cells.

2. The display device according to claim 1, wherein the display device is a digital display screen.

3. The display device according to claim 2, wherein the display device is a flexible screen.

4. The display device according to claim 1, wherein said image zones are pixels.

5. The display device according to claim 1, wherein said lenticular array comprises a juxtaposition of identical rectilinear lenses, with the longitudinal axis of the lenticular array being parallel to the array of photovoltaic cells.

6. The display device according to claim 1, wherein the lenses of said lenticular array are selected from the group formed by plane-convex, biconvex, symmetric, asymmetric, spherical and/or aspherical lenses, or by variable-index lenses.

7. The display device according to claim 1, wherein said array of photovoltaic cells is protected by a protective layer having an antireflection layer.

8. The display device according to claim 1, wherein said photovoltaic cells are thin-film cells based on one of amorphous silicon, microcrystalline silicon, CdTe, CIGS, and polymers.

9. The display device according to claim 1, wherein said photovoltaic cells are at least partially transparent to visible light.

10. The display device according to claim 1, wherein said image zones are ordered in such a way that various groups of image zones generate different images.

11. The display device according to claim 1, wherein an external face of the display comprises a tactile film or layer.

12. The display device according to claim 1, wherein said device includes two different sets of photovoltaic cells; one set dedicated to the photovoltaic conversion of ambient or external light, and another set dedicated to the photovoltaic conversion of internal of diffused light provided by the image zones and/or by the backlighting light source.

13. The display device according to claim 12, wherein the device includes a first set of photovoltaic cells arranged on the external surface of a photovoltaic plate in order to convert the external light, and a second set of photovoltaic cells arranged on the internal surface of the photovoltaic plate in order to convert the internal light.

14. A portable or fixed electronic apparatus comprising a digital display screen according to claim 2.

15. A photovoltaic plate with integrated lenses for the manufacture of a display device according to claim 1, comprising a transparent film or substrate, said film or substrate comprising a lenticular array, and said film or substrate comprising an array of photovoltaic cells.

16. Method of manufacturing a display device with integrated photovoltaic cells, in which a digital display screen comprising a smooth external surface is provided, and in which a photovoltaic plate with integrated lenses according to claim 15 is provided, and in which said photovoltaic film with integrated lenses is fixed, onto said digital display screen so as to form a digital display screen with integrated photovoltaic cells.

17. The photovoltaic plate according to claim 15 wherein said transparent film or substrate is flexible or semi-rigid.

18. The photovoltaic plate according to claim 15 wherein said photovoltaic cells are protected by at least one continuous or discontinuous protective layer.

19. The method according to claim 16 wherein the fixing of said integrated lenses includes gluing said lenses onto said digital display screen.

\* \* \* \* \*